US011695040B2

(12) United States Patent
Chabak et al.

(10) Patent No.: US 11,695,040 B2
(45) Date of Patent: Jul. 4, 2023

(54) SELF-ALIGNED GATE AND DRIFT DESIGN FOR HIGH-CRITICAL FIELD STRENGTH SEMICONDUCTOR POWER TRANSISTORS WITH ION IMPLANTATION

(71) Applicant: Government of the United States, as represented by the Secretary of the Air Force, Wright-Patterson AFB, OH (US)

(72) Inventors: Kelson D Chabak, Springboro, OH (US); Andrew J Green, Beavercreek, OH (US); Gregg H Jessen, Beavercreek, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 0 days.

(21) Appl. No.: 17/210,635

(22) Filed: Mar. 24, 2021

(65) Prior Publication Data

US 2021/0234001 A1 Jul. 29, 2021

Related U.S. Application Data

(62) Division of application No. 16/869,042, filed on May 7, 2020, now Pat. No. 11,398,551.

(Continued)

(51) Int. Cl.
*H01L 29/08* (2006.01)
*H01L 29/417* (2006.01)

(52) U.S. Cl.
CPC ...... *H01L 29/0873* (2013.01); *H01L 29/0856* (2013.01); *H01L 29/41775* (2013.01)

(58) Field of Classification Search
CPC combination set(s) only.
See application file for complete search history.

(56) References Cited

U.S. PATENT DOCUMENTS

| 5,198,379 A | 3/1993 | Adan |
| 6,620,697 B1 | 9/2003 | Alok et al. |

(Continued)

FOREIGN PATENT DOCUMENTS

EP 2117039 A2 11/2009

OTHER PUBLICATIONS

Chabak et al., "Recessed-Gate Enhancement-Mode Beta-Ga2O3 MOSFETs," IEEE Electronic Device Letters, vol. 39, No. 1, Jan. 2018.

*Primary Examiner* — Moin M Rahman
(74) *Attorney, Agent, or Firm* — AFMCLO/JAZ; Charles R. Figer, Jr.

(57) ABSTRACT

Methods of forming a self-aligned gate (SAG) and self-aligned source (SAD) device for high $E_{crit}$ semiconductors are presented. A dielectric layer is deposited on a high $E_{crit}$ substrate. The dielectric layer is etched to form a drift region. A refractory material is deposited on the substrate and dielectric layer. The refractory material is etched to form a gate length. Implant ionization is applied to form high-conductivity and high-critical field strength source with SAG and SAD features. The device is annealed to activate the contact regions. Alternately, a refractory material may be deposited on a high $E_{crit}$ substrate. The refractory material is etched to form a channel region. Implant ionization is applied to form high-conductivity and high $E_{crit}$ source and drain contact regions with SAG and SAD features. The refractory material is selectively removed to form the gate length and drift regions. The device is annealed to activate the contact regions.

22 Claims, 11 Drawing Sheets

Related U.S. Application Data

(60) Provisional application No. 62/844,274, filed on May 7, 2019.

(56) References Cited

U.S. PATENT DOCUMENTS

| | | | |
|---|---|---|---|
| 6,825,531 B1 | 11/2004 | Mallikarjunaswamy | |
| 9,040,398 B2 | 5/2015 | Saxler et al. | |
| 2011/0042752 A1* | 2/2011 | Mayuzumi | H01L 21/2855 257/E21.409 |
| 2011/0081754 A1* | 4/2011 | Jagannathan | H01L 21/823842 257/E21.632 |
| 2013/0295732 A1* | 11/2013 | Wu | H01L 29/66477 438/290 |

* cited by examiner

SELF-ALIGNED GATE AND DRIFT DESIGN FOR HIGH-CRITICAL FIELD STRENGTH SEMICONDUCTOR POWER TRANSISTORS WITH ION IMPLANTATION

CROSS-REFERENCE TO RELATED APPLICATIONS

This application is a divisional of U.S. application Ser. No. 16/869,042, entitled, "Self-Aligned Gate and Drift Design for High-Critical Field Strength Semiconductor Power Transistors with Ion Implantation," filed on May 7, 2020, which claims the benefit of and priority to U.S. Provisional Application Ser. No. 62/844,274, entitled "Self-Aligned Gate and Drift Design for High-Critical Field Strength Semiconductor Power Transistors with Ion Implantation," filed on May 7, 2019, the entireties of which are incorporated by reference herein.

RIGHTS OF THE GOVERNMENT

The invention described herein may be manufactured and used by or for the Government of the United States for all governmental purposes without the payment of any royalty.

BACKGROUND OF THE INVENTION

Field of the Invention The present invention generally relates to power transistors and, more particularly, to processes to fabricate high-critical field strength semiconductor power transistors.

DESCRIPTION OF THE RELATED ART

Transistors made with high-critical field strength ($E_{crit}$) semiconductors (those with a bandgap energy surpassing gallium nitride {GaN}) have high resistance between the (1) low-field mobility region between gate and source contacts and (2) the high-voltage region between gate and drain contacts, referred to as the drift region ($W_d$). Both regions must be precisely engineered to obtain ultra-low on-resistance ($R_{on}$) for a given breakdown voltage ($V_{bk}$). Contemporary fabrication methods and materials are compatible with contemporary optical lithography equipment because the $E_{crit}$ is smaller, which relaxes a self-aligned drift region to one or more micrometers in geometry. Dimensions greater than 1 micrometer can readily be achieve with optical lithography. However, the problem is unique for high $E_{crit}$ transistors because (1) the drift region dimension scales to sub-micrometer geometry using the relationship $W_d=2*V_{bk}/E_{crit}$ for a given application requiring a certain $V_{bk}$ and (2) some $E_{crit}$ semiconductors, such as gallium oxide ($Ga_2O_3$), have low thermal activation energy for impurity doping introduced by ion implantation technology. As an example, for an application requiring $V_{bk}=200V$ or less, $Ga_2O_3$ ($E_{crit}=8$ MV/cm) would require less than 0.5 micrometers drift region and is challenging to precisely define with contemporary optical lithography and fabrication. Accordingly, there is a need in the art for a methodology to fabricate high $E_{crit}$ transistors.

SUMMARY OF THE INVENTION

Embodiments of the invention provide a process of fabricating high $E_{crit}$ transistors, which includes depositing one or more high $E_{crit}$ insulators to function as the gate insulator, implant cap, and electric-field management layers on a high $E_{crit}$ substrate with high $E_{crit}$ epitaxial layer(s) grown on the substrate surface. The insulating materials may be defined by a combination of optical and nanolithography which form self-aligned gate and drift regions (SAG+SAD). A refractory material layer may then be subsequently deposited by standard lift-off or defined subtractively by one or more etching steps to form the SAG+SAD feature. A combination of insulating layers and/or the refractory material layer may serve as a hard mask for ion-implantation. An optional high $E_{crit}$ insulator layer may also be deposited conformally with optional etch back process acts as an ion-implantation spacer layer to enhance gate-to-source electrical isolation in some embodiments. The ion-implanted impurities require a high-temperature activation step and may include the oxide and refractory material layers defined prior to ion-implantation. The implant cap may then be removed using one or more etch processes before or after the high-temperature to allow ohmic contact metal deposition. Additional metal interconnect layers may then be deposited to electrically probe the transistor and/or to reduce transistor electrode resistance.

A first embodiment for forming a self-aligned gate and self-aligned source (SAG+SAD) device for high $E_{crit}$ semiconductors is presented. This method includes depositing a first dielectric layer on a high $E_{crit}$ device layer. The first dielectric layer is etched to define a drift region. A refractory material is deposited on the substrate and first dielectric layer. The refractory material is etched to define the gate length. Implant ionization is applied to form high-conductivity and high-critical field strength source and drain contact regions along with the SAG+SAD feature. The device is annealed to activate the source and drain contact regions. In some of these embodiments, the device layers may comprise an n-type $Ga_2O_3$ grown on semi-insulating $Ga_2O_3$ or active regions defined in the substrate itself. In other embodiments, the substrate may comprise an n-type $Ga_2O_3$ bonded to a high thermal conductivity wafer.

Some embodiments further include depositing a second dielectric layer on the substrate prior to depositing the first dielectric layer. These embodiments may further include selectively removing the second dielectric layer after the implant ionization to expose the source and drain contact regions. In some of these embodiments, the second dielectric layer may comprise more than one material. In these particular embodiments, the second dielectric layer may comprise an alternating stack or may comprise a bi/tri layer dielectric. In some embodiments, the first dielectric may be selected from $SiO_2$, $Al_2O_3$, AlN, or any other material, which can be selectively etched, with insulating properties and high $E_{crit}$. These and other embodiments may further include depositing a third dielectric layer after etching the first dielectric and prior to depositing the refractory material. These embodiments additionally include selectively removing the third dielectric layer after the implant ionization to expose the source and drain contact regions.

In some embodiments, the etching of the first dielectric includes patterning the dielectric with one of optical lithography and nanolithography and etching with one or a combination of wet and dry etching. In these and other embodiments, etching the refractory material may include patterning the refractory material with one of optical lithography and nanolithography and removing material with one of wet or dry etching. In some embodiments, the refractory material comprises tungsten.

A second embodiment for forming a self-aligned gate and self-aligned source (SAG+SAD) device for high $E_{crit}$ semiconductors is also presented. This method includes depositing a refractory material on a high $E_{crit}$ device layer. The refractory material is etched to form a channel region. Implant ionization is applied to form high-conductivity and high-critical field strength source and drain contact regions and a SAG+SAD feature. The device is then annealed to activate the source and drain contact regions. In some of these embodiments, the substrate comprises an n-type $Ga_2O_3$ grown on semi-insulating $Ga_2O_3$. In other embodiments, the substrate may comprise an n-type $Ga_2O_3$ bonded to a high thermal conductivity wafer.

In some embodiments, the method may further include depositing a first dielectric layer on the substrate prior to depositing the refractory material. In these embodiments, the method may also further include selectively removing the first dielectric layer after the implant ionization to expose the source and drain contact regions. In some embodiments, the first dielectric layer may include more than one material. In these embodiments, the first dielectric layer may comprise an alternating stack or the first dielectric layer may comprise a bi/tri layer dielectric. In some embodiments the first dielectric may be selected from $SiO_2$, $Al_2O_3$, AlN, or any other material with insulating properties and high $E_{crit}$.

Some embodiments may include depositing a second dielectric layer after etching the refractory material and prior to implant ionization. These embodiments may also include selectively removing the second dielectric layer after the implant ionization to expose the source and drain contact regions.

In some embodiments, etching the refractory material may include patterning the refractory material with one of optical lithography and nanolithography and removing material with one of wet or dry etching. In some of these and other embodiments, the refractory material comprises tungsten.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Embodiments of the invention provide methodology allowing for a self-aligned gate-to-source and self-aligned drift (SAG+SAD) regions for high $E_{crit}$ semiconductors (greater than 3.4 eV), such as gallium oxide ($Ga_2O_3$), using a combination of refractory material, subtractive etch technology, and dielectric masking layers fabricated with nanolithography.

Embodiments of the invention include steps such as depositing one or more high $E_{crit}$ insulators to function as the gate insulator, implant cap, and electric-field management layers on high $E_{crit}$ substrate with high $E_{crit}$ epitaxial layer(s) grown on the substrate surface. These insulating materials may be defined by a combination of optical and nanolithography, which form the self-aligned gate and drift regions (SAG+SAD). A refractory material layer may then be subsequently deposited by standard lift-off or defined subtractively by one or more etching steps to form the SAG+SAD feature in some embodiments. A combination of insulating layers and/or the refractory material layer may serve as a hard mask for ion-implantation in some embodiments. In these and other embodiments, an optional high $E_{crit}$ insulator sidewall spacer layer may be deposited conformally with optional etch back process. This layer may then act as an ion-implantation spacer layer to enhance gate-to-source electrical isolation. The ion-implanted donors require a high-temperature activation step and may include the oxide and metal layers defined prior to ion-implantation. The implant screen may then be removed using one or more etch processes before or after the high-temperature to allow ohmic contact metal deposition. Additional metal interconnect layers may then be deposited to reduce transistor electrode resistance.

Figure 1:
FIGS. 1-9 illustrate a series of steps consistent with an exemplary embodiment of the invention for fabricating high $E_{crit}$ transistors.
Figure 1:
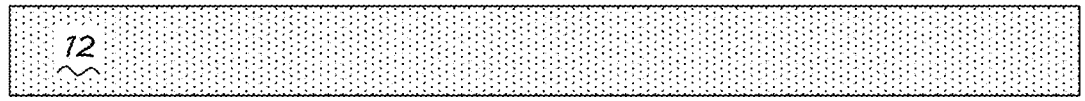
Figure 2:
Figure 2:
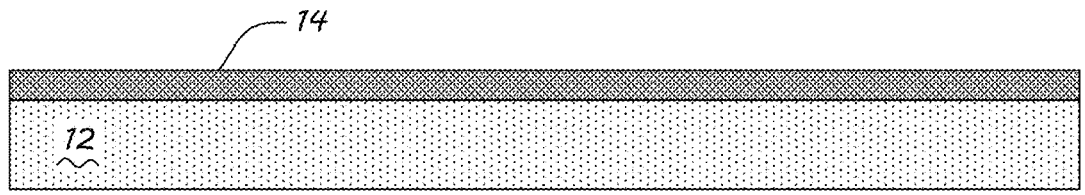
Figure 3:
Figure 3:
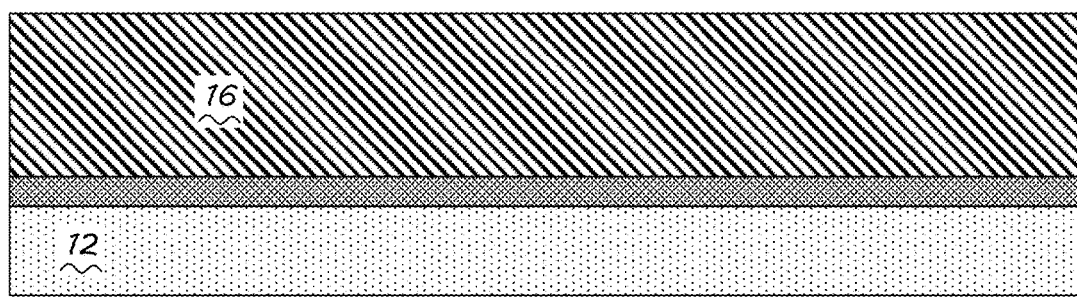
Figure 4:
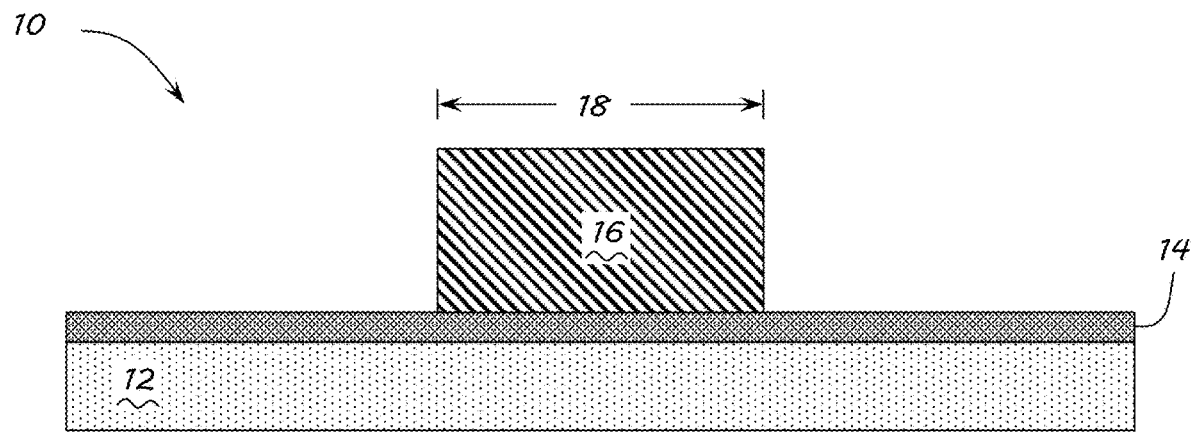

Turning now to the drawings and FIG. 1, a process 10 for an exemplary embodiment begins with high $E_{crit}$ epitaxial layer(s) deposited on a lattice-matched substrate and/or alternately bonded onto a mechanical and/or high thermal conductivity carrier wafer (substrate 12) in some embodiments. The substrate could include materials such as n-type $Ga_2O_3$ grown on semi-insulating bulk $Ga_2O_3$ or these same materials bonded to a wafer with high thermal conductivity such as SiC and diamond. As illustrated in FIG. 2, an optional dielectric layer 14 may be deposited on the substrate 12 to function as an etch stop, implant ionization (I/I) cap, and/or gate dielectric. In other embodiments, dielectric layer 14 may be comprised of more than one material like an alternating stack or bi/try-layer dielectric, for example. A second dielectric layer 16 with high $E_{crit}$ is then deposited on top of dielectric layer 14 as illustrated in FIG. 3. In other embodiments, dielectric layer 16 may also be comprised of more than one material like an alternating stack or bi/try-layer dielectric, for example. The dielectric layers 14, 16 may be $SiO_2$, $Al_2O_3$ and AlN as examples of those with insulating properties and high $E_{crit}$. Dielectric layer 16 may then be patterned by one or a combination of wet and dry etching with an optical lithography step and/or nanolithography such as electron beam lithography. The remaining material defines an initial drift region dimension 18.

Figure 5:
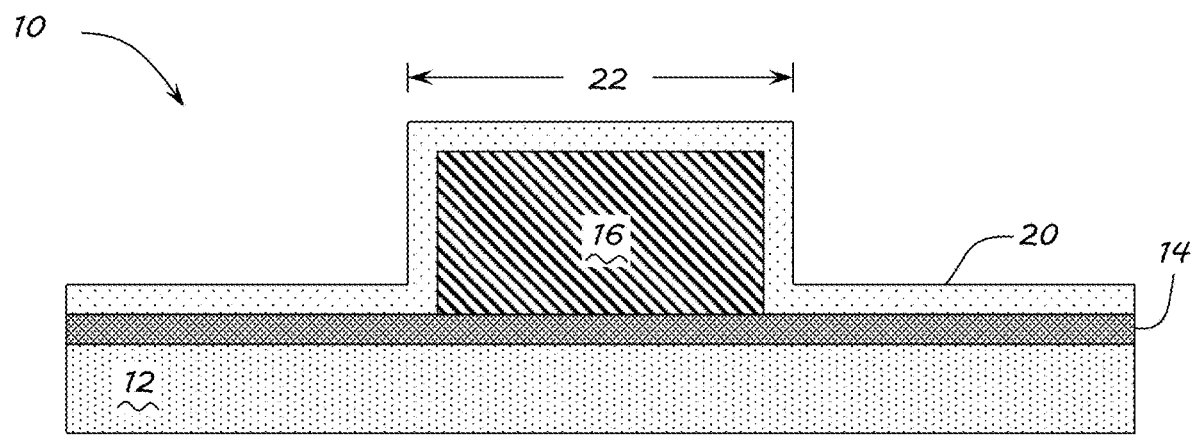
Figure 6:
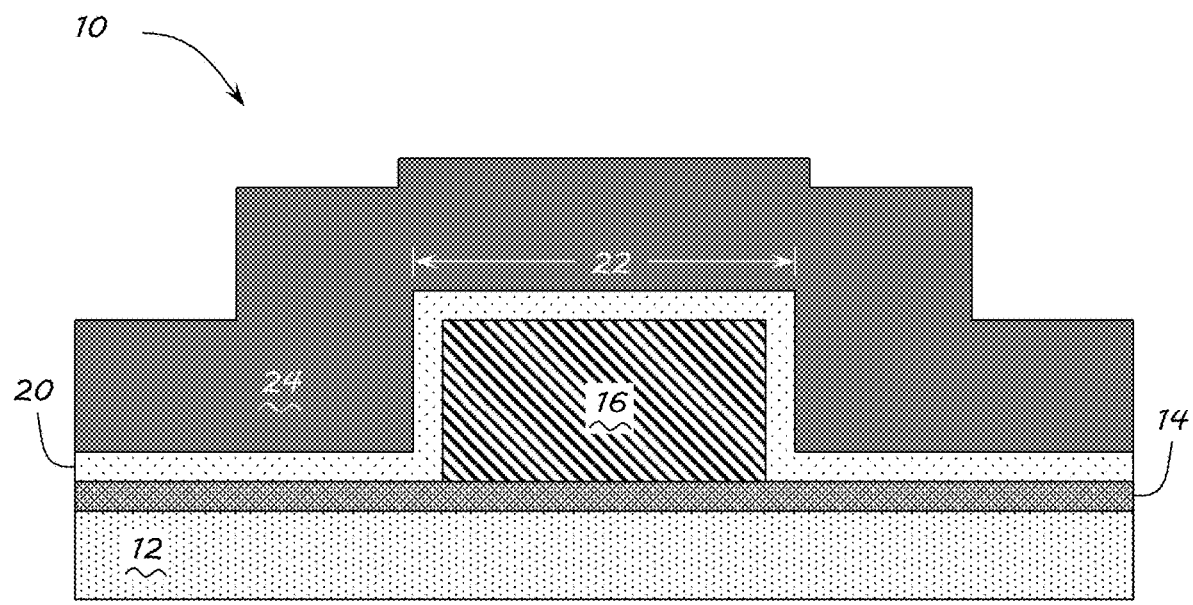
Figure 7:
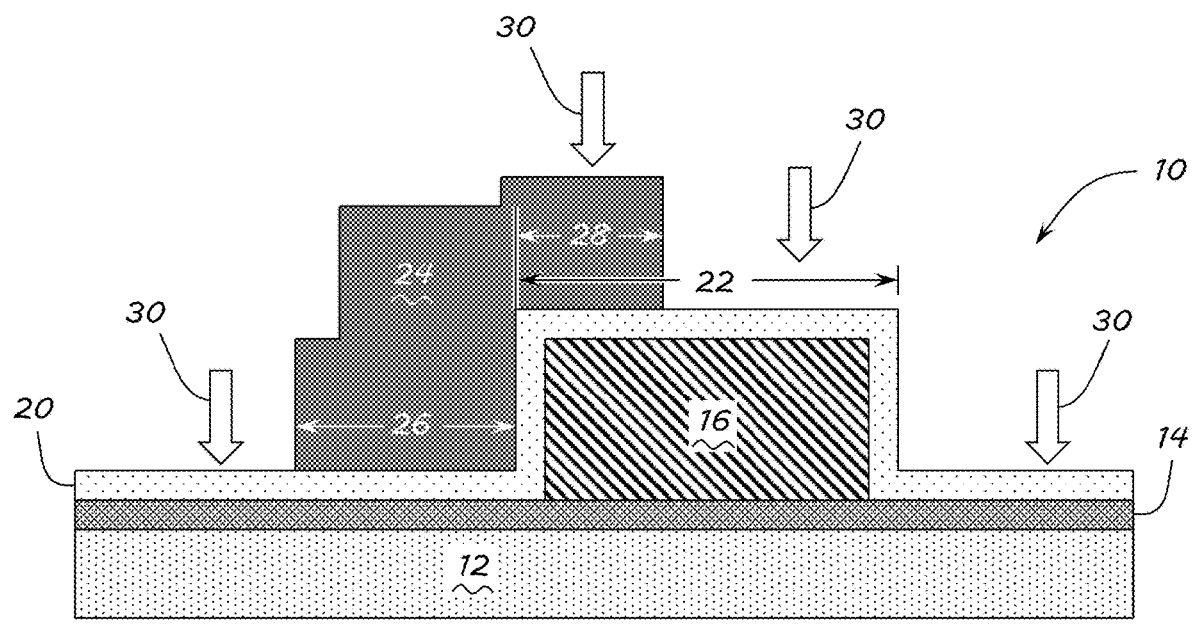

In this illustrated embodiment, an optional dielectric 20, such as $Al_2O_3$, may be deposited for one or a combination of etch stop, implant ionization cap, implant spacer, or a gate dielectric, or an implant ionization mask as illustrated in FIG. 5, expanding the drift region dimension 22. Next, a refractory material 24, such as Tungsten (W), with low resistance may be deposited on the optional dielectric 20 as illustrated in FIG. 6. This refractory material layer 24 may be patterned and material removed by wet or dry etching to form the gate length 26 as illustrated in FIG. 7. An optional gate-connected field plate (GC-FP) 28 may be formed on top of dielectric layer 16 with length not to exceed the drift region dimension 22.

Figure 8:
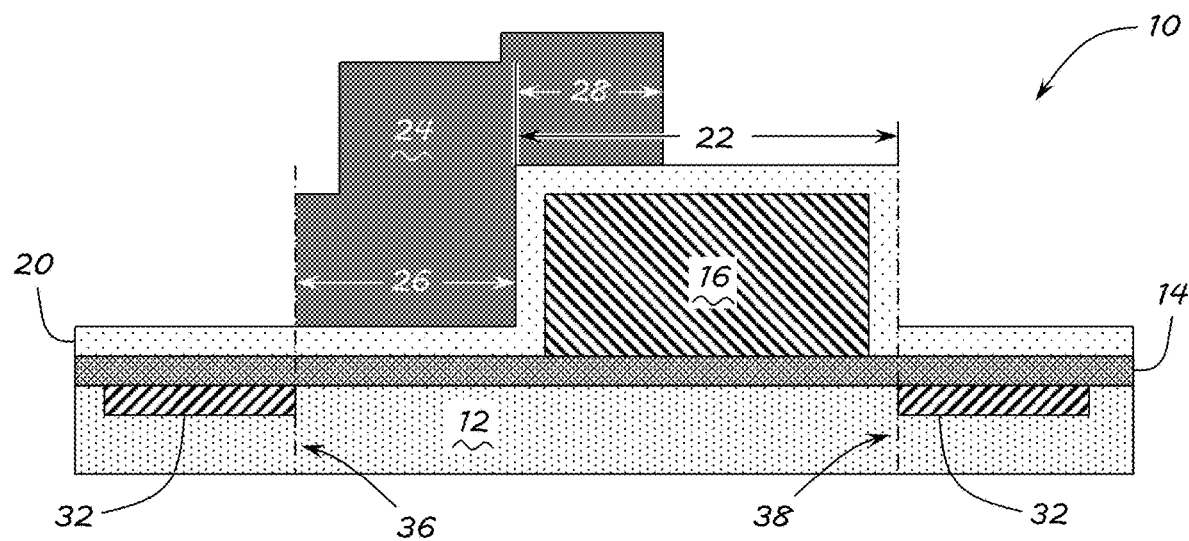
Figure 9:
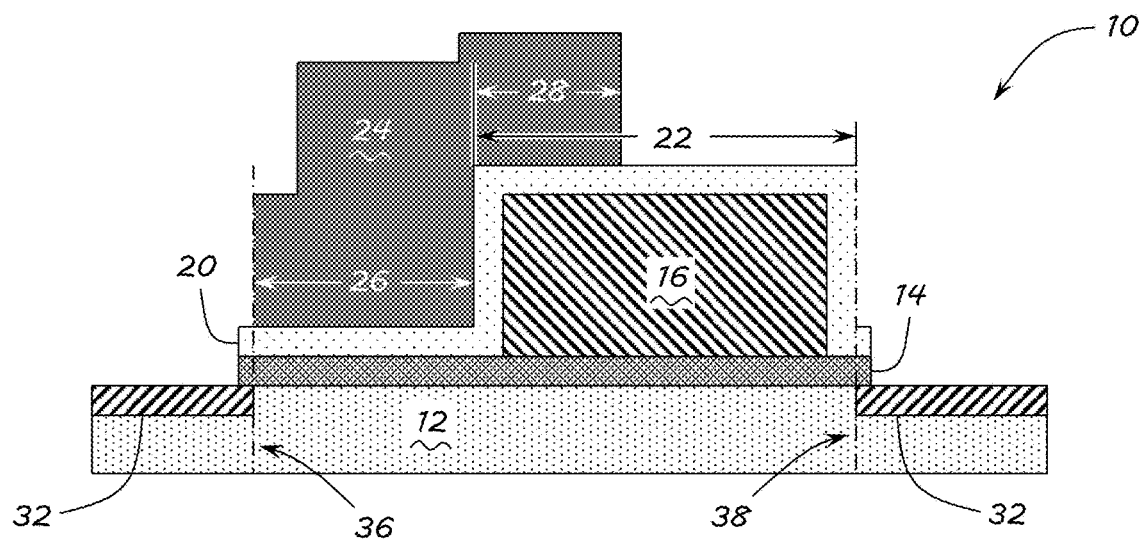

The structure may then be subjected to an implant ionization (I/I) step 30 to form high-conductivity and high $E_{crit}$ source and drain contact regions 32 in the high $E_{crit}$ substrate 12 as seen in FIGS. 7 and 8. Refractory material 24 and dielectric layers 16, 20 are a hard mask, which protects the channel region from I/I 30 and forms the self-aligned gate 36 plus the self-aligned drift 38 feature as illustrated in FIG. 8. The channel region is equal to the sum of the gate-length 26 and the calculated drift region 22. Dielectric layers 14, 20 may then be selectively removed on top of the source and drain contact regions 32 to allow for subsequent ohmic contact metal electrodes by a combination of wet and/or dry etching as illustrated in FIG. 9. Finally, the structure may be annealed at high temperature (>800 C) to activate the source and drain contact regions 32 in high $E_{crit}$ substrate 12. Conventional electrical isolation, metal interconnects and surface passivation layers may be used after the high-temperature anneal step.

Figure 10:
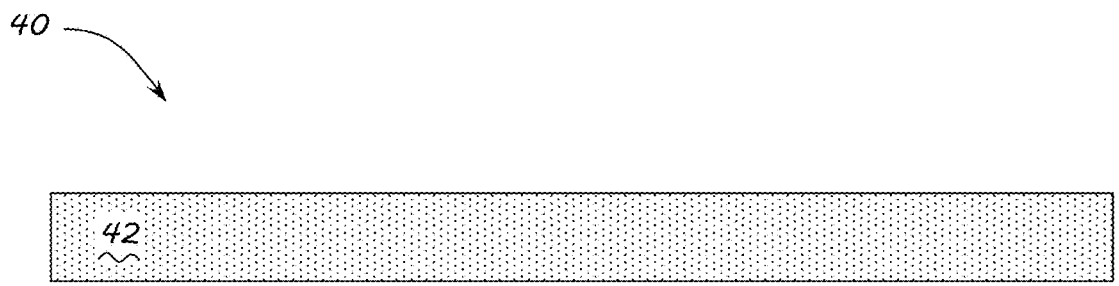
FIGS. 10-17 illustrate a series of steps consistent with an alternate exemplary embodiment of the invention for fabricating high $E_{crit}$ transistors.
Figure 11:
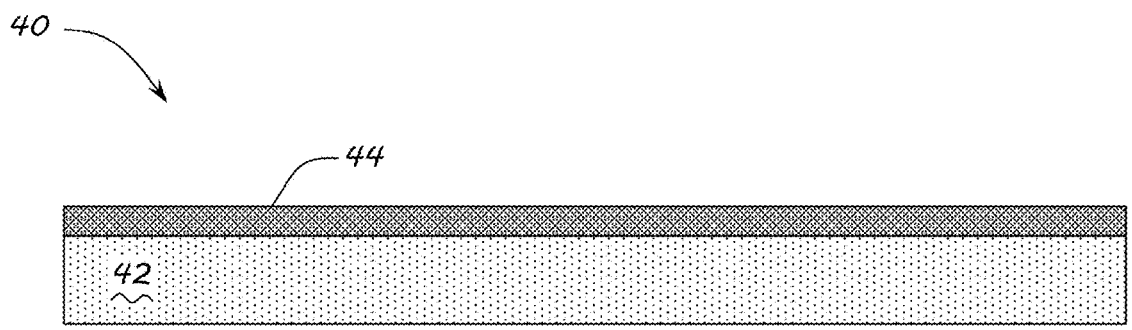
Figure 12:
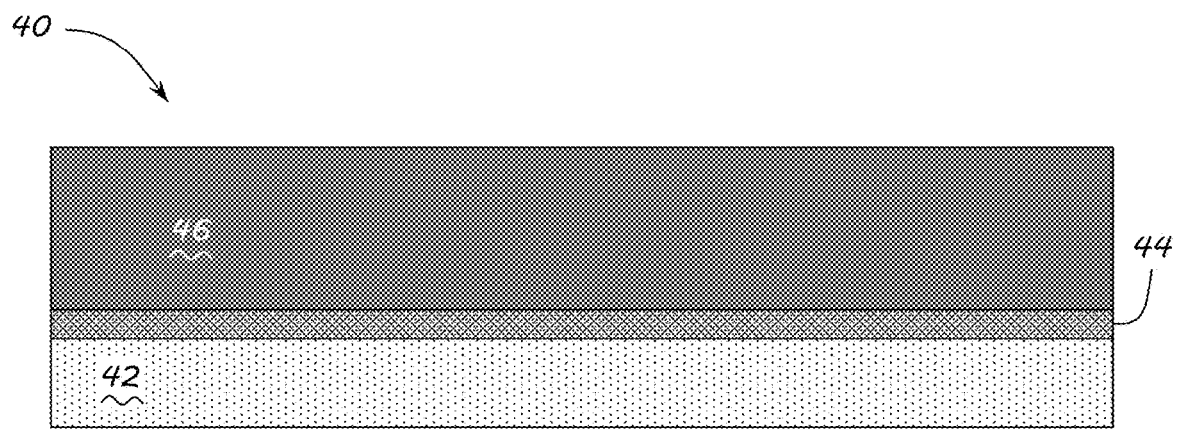
Figure 13:
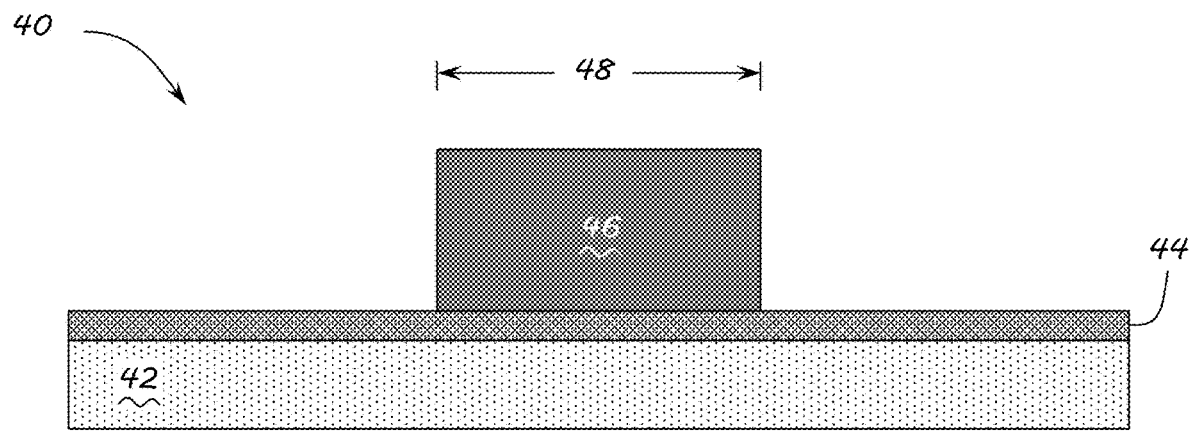

In an alternate process 40, high $E_{crit}$ epitaxial layer(s) may be deposited on a lattice-matched substrate and/or alternately may be bonded onto a mechanical and/or high thermal conductivity carrier wafer (substrate 42 in FIG. 10) in some embodiments. The substrate could include materials such as n-type $Ga_2O_3$ grown on semi-insulating bulk $Ga_2O_3$ or these same materials bonded to a wafer with high thermal conductivity such as SiC and diamond. As illustrated in FIG. 11, an optional single or composite dielectric layer 44 may be deposited on the substrate 42 to function as a gate oxide, etch stop, implant ionization (I/I) cap and/or surface passivation layer. The dielectric layer 44 may be $SiO_2$, $Al_2O_3$, and AlN as examples of those with insulating properties and high $E_{crit}$. A refractory material 46, such as Tungsten, with low resistance may then be deposited on the dielectric layer 44 as illustrated in FIG. 12. Refractory material 46 may then be patterned by an optical lithography step and/or nanolithography such as electron beam lithography to precisely form the channel region 48 as illustrated in FIG. 13. In this illustrated embodiment, an optional dielectric 50 such as $Al_2O_3$, may be deposited for one or a combination of etch stop, implant ionization cap, implant spacer, gate dielectric, or an implant ionization mask as illustrated in FIG. 14 expanding the drift region dimension 52.

Figure 14:
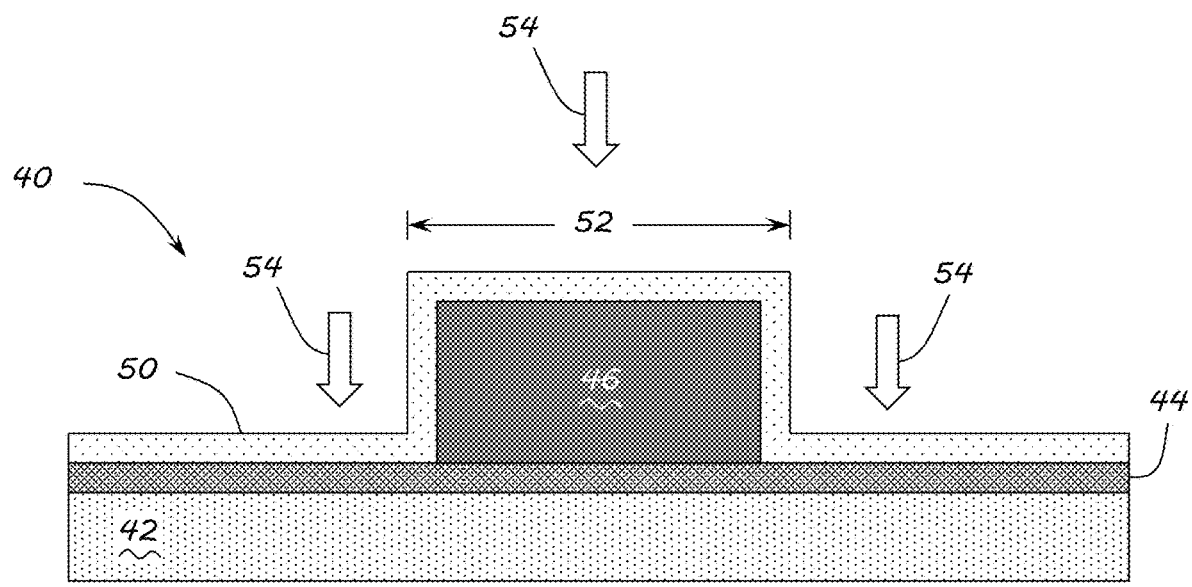
Figure 15:
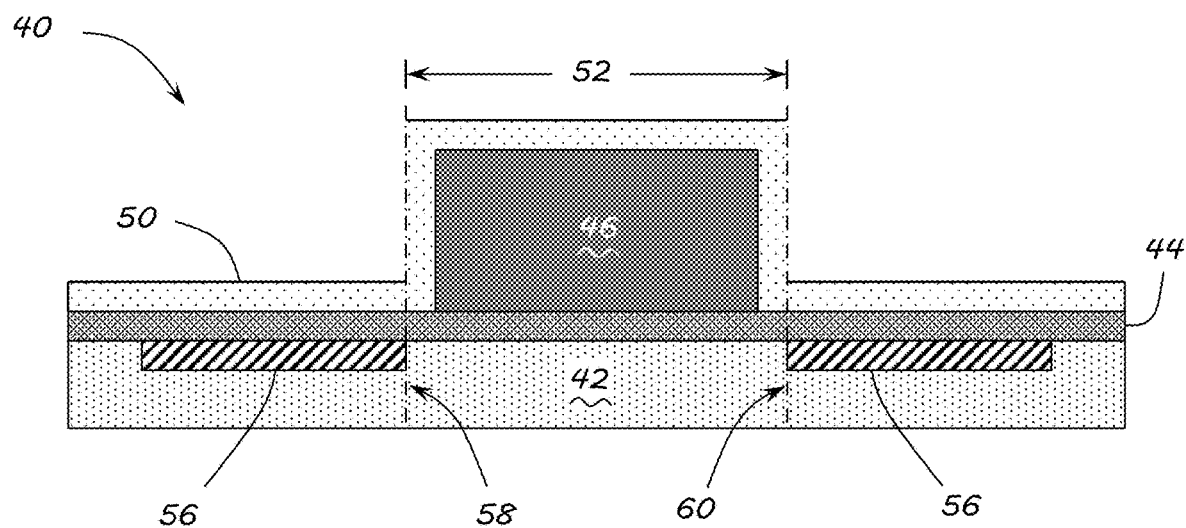
Figure 16:
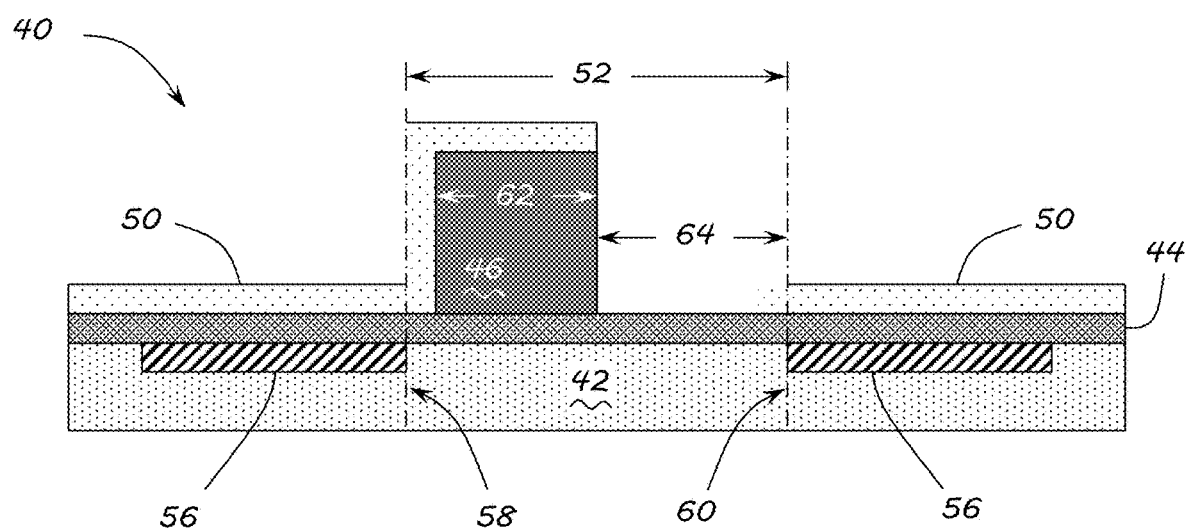
Figure 17:
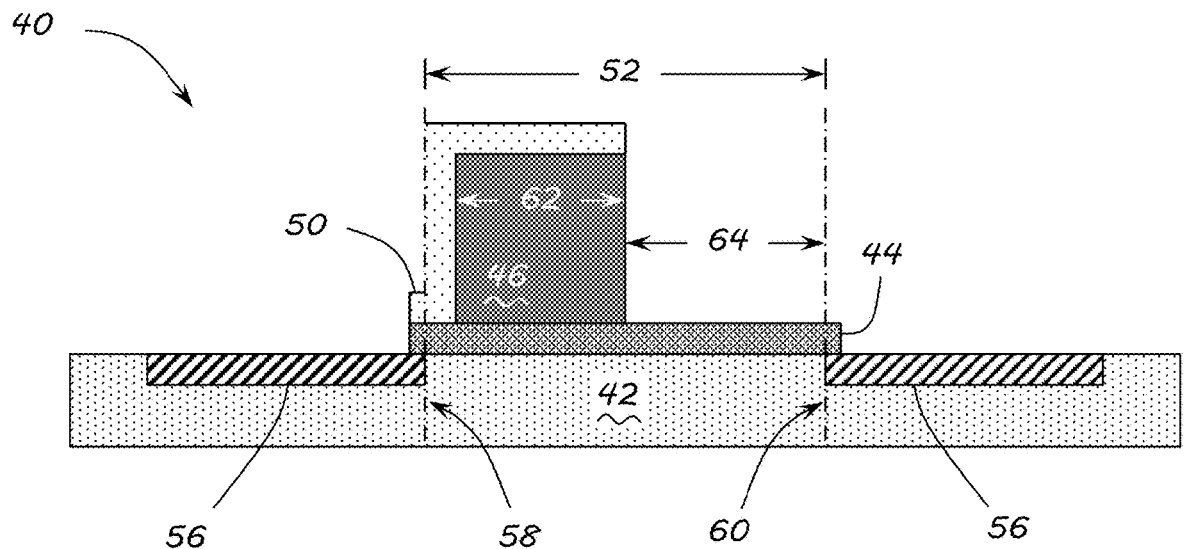

The structure may then be subjected to an I/I step 54 to form high-conductivity source and drain contact regions 56 in the high $E_{crit}$ substrate 42 as illustrated in FIGS. 14 and 15. Refractory material 46 and sidewall spacer 50 acts as a hard mask material, which protects the channel region from I/I step 50 and forms the self-aligned gate 58 plus the self-aligned drift 60 feature as illustrated in FIG. 15. Then refractory material 46 may be patterned by an optical lithography step and/or nanolithography such as electron beam lithography and a portion removed by wet or dry etching to form the gate contact 62 and drift region 64 as illustrated in FIG. 16. Dielectric layers 44, 50 may then be selectively removed on top of the source and drain contact regions 56 to allow for subsequent ohmic contact metal electrodes by a combination of wet and/or dry etching as illustrated in FIG. 17. Finally, the sample may be annealed at high temperature (>800 C) to activate the I/I species in the source and drain contact regions 56. Conventional electrical isolation, metal interconnects and surface passivation layers can be used after the high-temperature anneal step.

Figure 18:
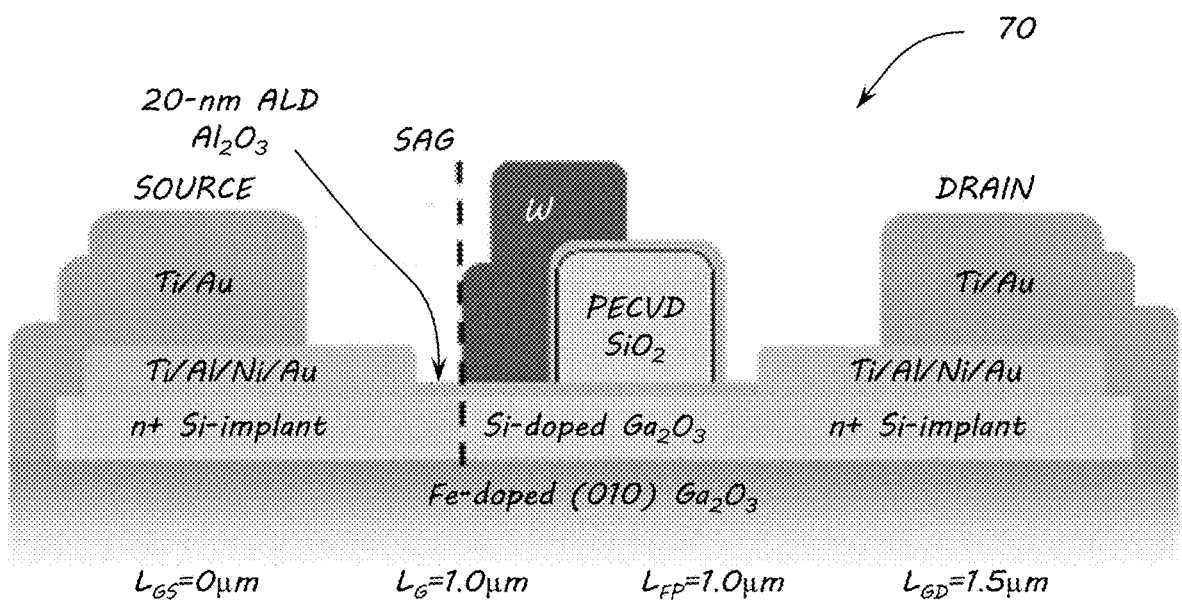
FIG. 18 is a schematic cross section for an exemplary self-aligned gamma-gate (SAGG) MOSFET consistent with embodiments of the process illustrated in FIGS. 1-9.

Turning to FIG. 18, an exemplary self-aligned gamma gate (SAGG) device 70 may use the embodiments of the invention presented above in relation to FIGS. 1-9. This exemplary transistor is a single homoepitaxial Si-doped beta-phase gallium oxide (BGO) channel grown by MOVPE. A $SiO_2$ mask forms the drift region then both a conformal ALD $Al_2O_3$ gate dielectric and sputtered W layer are deposited. The W is selectively etched forming a gamma-shaped gate electrode followed by an n+Si ion implantation step to form the SAGG feature. The device has standard mesa, ohmic contacts with 470° C. rapid thermal anneal, and Ti/Au interconnect metallization prior to characterization.

Figure 19:
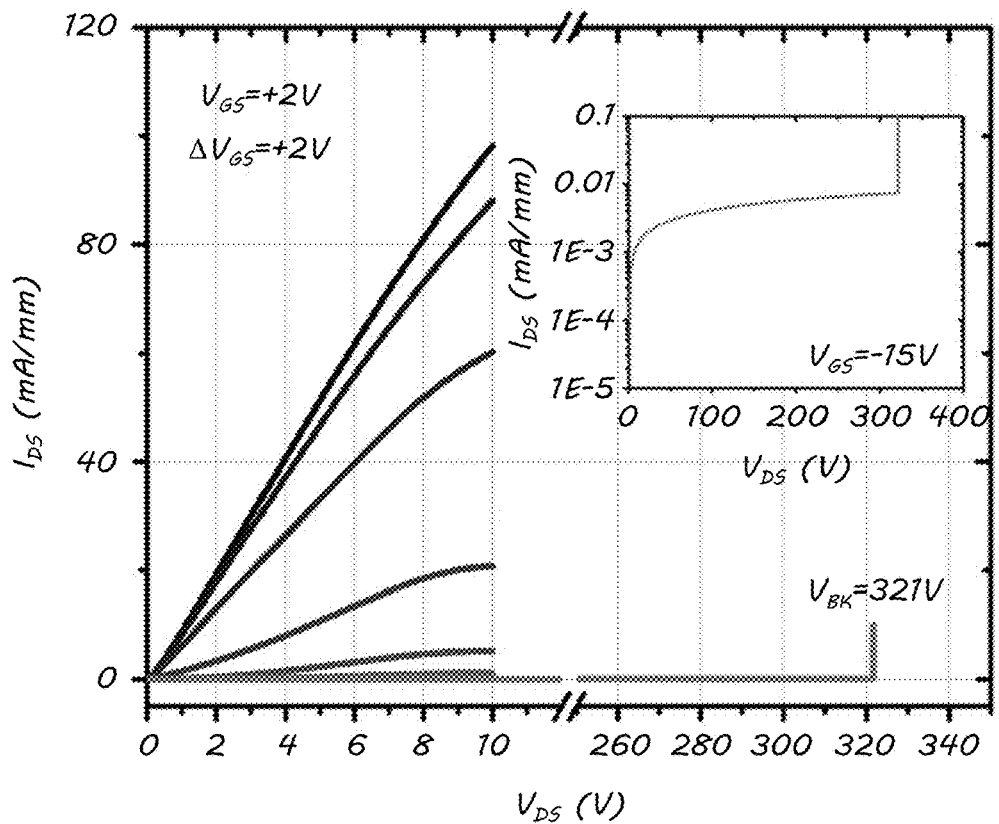
FIG. 19 is a graph of $I_{DS}$-$V_{DS}$ output family of curves with inset of $V_{BK}$ vs. log $I_{DS}$ for the exemplary SAGG MOSFET of FIG. 18.
Figure 20:
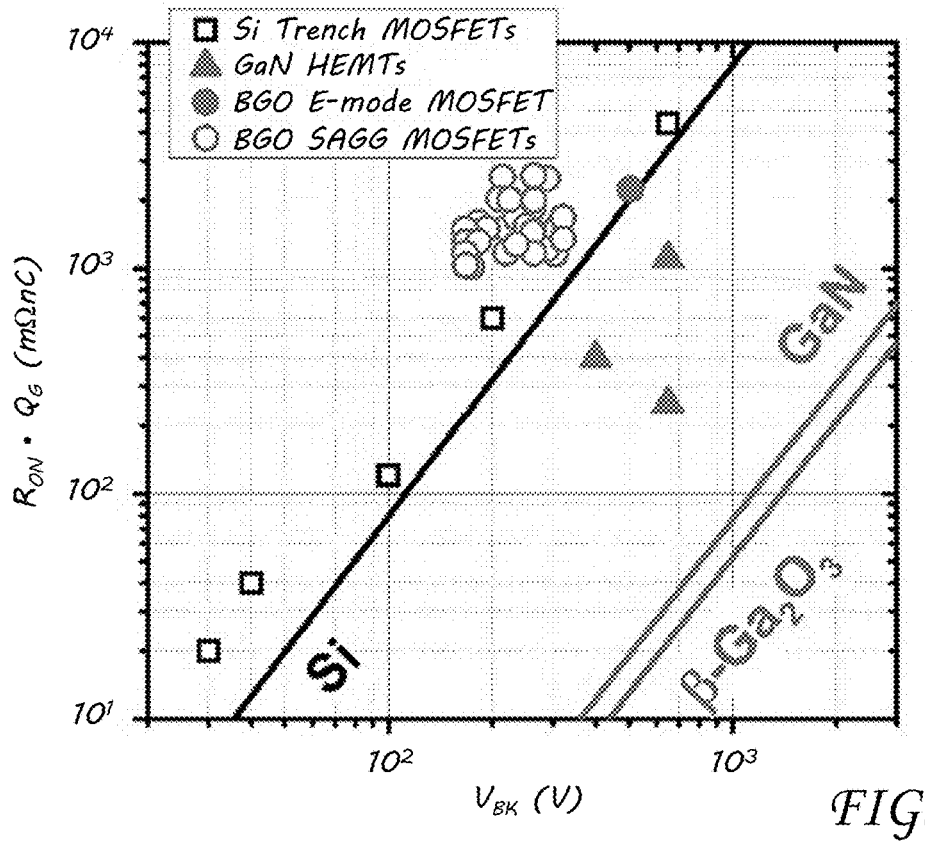
FIG. 20 is a $R_{ON}$·$Q_G$ figure of merit benchmark comparing the SAGG MOSFET of FIG. 18 with other contemporary devices.

FIGS. 19 and 20 show the dynamic switch loss performance of SAGG MOSFETs. In FIG. 19, the SAGG MOSFET dc performance is shown with $V_{BK}$=321 V for a 2.5 μm source-drain distance. Several SAGG MOSFETs were characterized by C–V to conservatively estimate the total $Q_G$ and determine the $R_{ON} \cdot Q_G$ Figure of Merit as illustrated in FIG. 20. The SAGG MOSFETs compare well to an E-mode BGO MOSFET and may be significantly improved with materials and device engineering to limit the gate swing while scaling the device to remove additional parasitic resistance.

Figure 21:
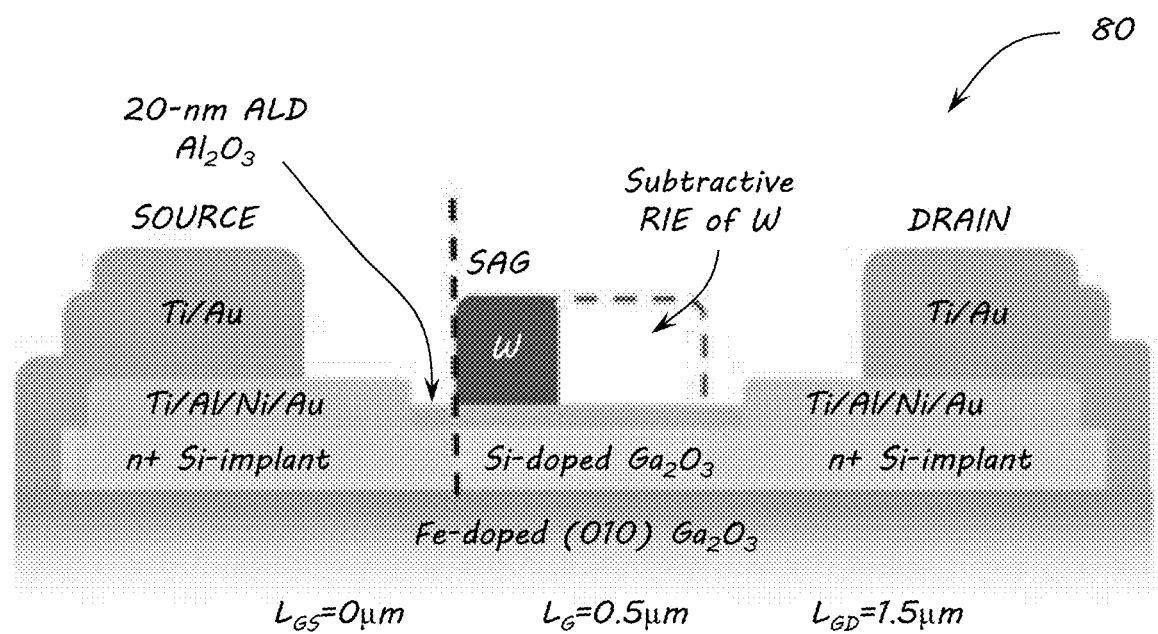
FIG. 21 is a schematic cross-section for an exemplary beta-phase gallium oxide (BGO) self-aligned gate (SAG) MOSFET consistent with embodiments of the process illustrated in FIGS. 10-17.

FIG. 21 illustrates an alternate exemplary SAG device 80 that may use the embodiments of the invention presented above in relation to FIGS. 10-17. This exemplary SAG device material is a single homoepitaxial Si-doped BGO channel grown by oxygen plasma MBE. The device process consists of depositing an ALD $Al_2O_3$ gate dielectric and patterning a Tungsten (W) layer to protect the transistor channel during an n+Si ion implantation process. The W mask is etched back to form the SAG electrode and drift region followed by a 900° C. implant activation process. Lastly, the device has standard mesa, ohmic contacts with 470° C. rapid thermal anneal, and Ti/Au interconnect metallization prior to characterization.

Figure 22:
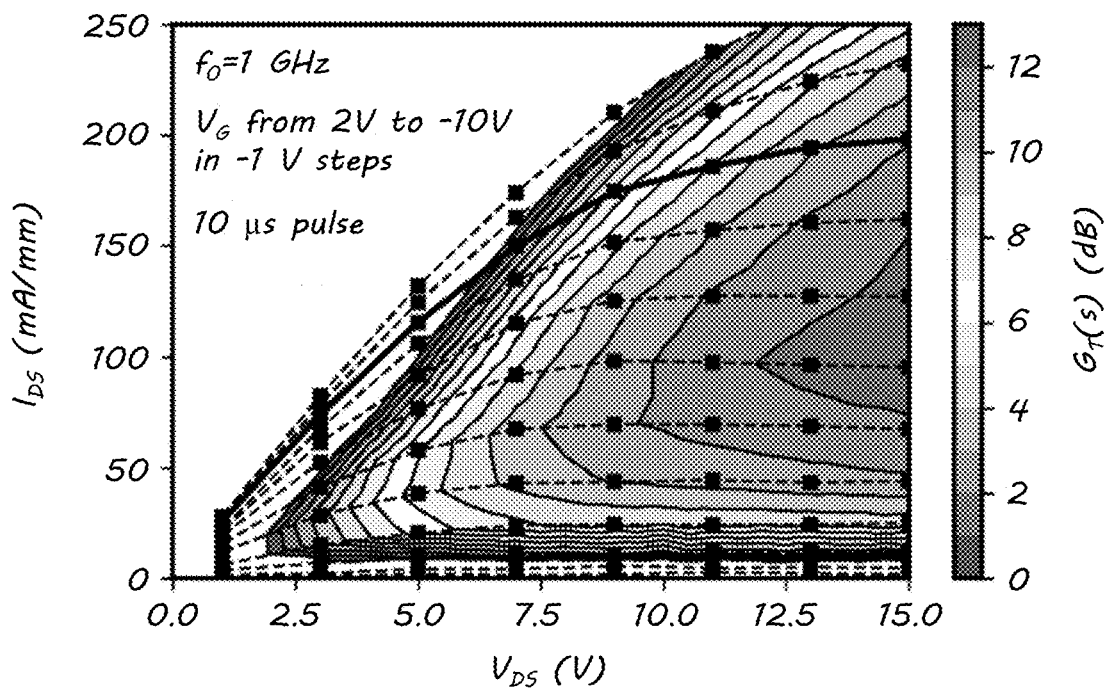
FIG. 22 is a graph of $I_{DS}$-$V_{DS}$ output family of curves pulsed from a $V_{GS}$=0, $V_{DS}$=0 quiescent point with transducer gain contours superimposed on the I-V plane of the SAG MOSFET of FIG. 21.
Figure 23:
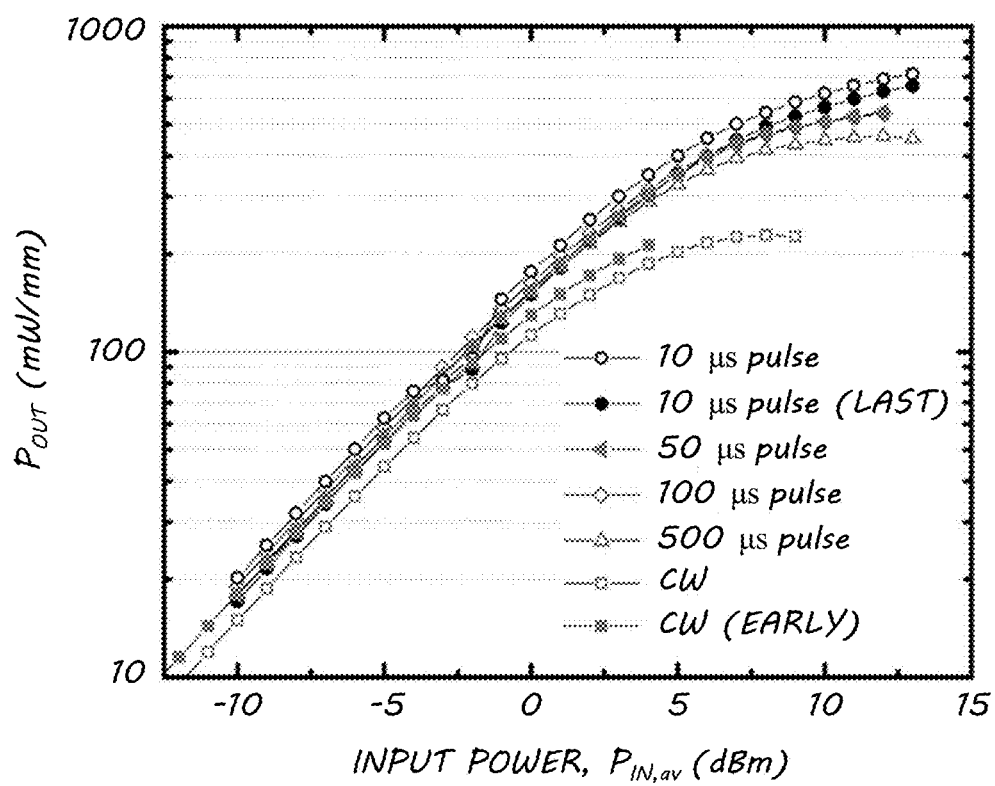
FIG. 23 is a graph of pulsed output power performance at 1 GHz for the SAG MOSFET of FIG. 21 at $V_{DS}$=15 V.

FIGS. 22 and 23 show the RF performance of the SAG MOSFET 80. The $f_T(f_{max})$ (not shown) is approximately 4 (13) GHz which is sufficient for 1 GHz load-pull characterization. In FIG. 22, the transducer gain ($G_T$) of the SAG MOSFET is shown in the pulsed IDS-VDS plane with $V_{GS}$=0, $V_{DS}$=0 quiescent point. The device delivers>20%

PAE and >0.7 W/mm using 10 µs pulses at 1 GHz. The variation in output power at 1 GHz as a function of pulse width is illustrated in FIG. 23.

High $E_{crit}$ transistors with the SAG+SAD feature will have dynamic power switching losses substantially less than contemporary state-of-the-art power transistors rated for the same voltage. For a given power loss target, high $E_{crit}$ transistors with SAG and/or SAD can accept much higher dynamic switch losses, or switch speed, since the conduction losses are orders of magnitude less. Higher switching speed 10×-100× faster than contemporary state-of-the-art has additional benefits of smaller passive component design that shrinks the size of power modules. Further, the high voltage capability of high $E_{crit}$ transistors allow integration of point-of-load power conversion directly from a high-voltage source for simplified power distribution with reduced cabling size and weight coupled with more compact power modules.

High $E_{crit}$ transistors fabricated with SAG+SAD technology may also assist in offering low on-resistance for a given $V_{bk}$ compared to other contemporary state-of-the-art semiconductor technology. These devices may be used in numerous applications such as dc-to-dc power conversion, pulsed power, and high-efficiency radio frequency switch-mode amplifiers.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method of forming a self-aligned gate (SAG) and self-aligned source (SAD) device for high $E_{crit}$ semiconductors, the method comprising:
    depositing a refractory material on a high $E_{crit}$ substrate;
    etching the refractory material to form a channel region;
    applying an implant ionization to form a high-conductivity source region and a high-conductivity drain contact region in the high $E_{crit}$ substrate creating a self-aligned gate plus self-aligned drift feature; and
    annealing to activate the source and drain contact regions, wherein the substrate comprises an n-type $Ga_2O_3$ grown on semi-insulating $Ga_2O_3$.

2. The method of claim 1, the method further comprising:
    depositing a first dielectric layer on the substrate prior to depositing the refractory material.

3. The method of claim 2, further comprising:
    selectively removing the first dielectric layer after the implant ionization to expose the high-conductivity source and high-conductivity drain contact regions.

4. The method of claim 2, wherein the first dielectric layer comprises more than one material.

5. The method of claim 4, wherein the first dielectric layer comprises an alternating stack.

6. The method of claim 4, wherein the first dielectric layer comprises a bi/tri layer dielectric.

7. The method of claim 2, wherein the first dielectric is selected from a group consisting of $SiO_2$, $Al_2O_3$, AlN, and combinations thereof.

8. The method of claim 1, wherein etching the refractory material comprises:
    patterning the refractory material with one of optical lithography and nanolithography; and
    removing material with one of wet or dry etching.

9. The method of claim 1, wherein the refractory material comprises tungsten.

10. The method of claim 1, further comprising:
    depositing a second dielectric layer after etching the refractory material and prior to implant ionization.

11. The method of claim 10, further comprising:
    selectively removing the second dielectric layer after the implant ionization to expose the source and drain contact regions.

12. A method of forming a self-aligned gate (SAG) and self-aligned source (SAD) device for high $E_{crit}$ semiconductors, the method comprising:
    depositing a refractory material on a high $E_{crit}$ substrate;
    etching the refractory material to form a channel region;
    applying an implant ionization to form a high-conductivity source region and a high-conductivity drain contact region in the high $E_{crit}$ substrate creating a self-aligned gate plus self-aligned drift feature; and
    annealing to activate the source and drain contact regions, wherein the substrate comprises an n-type $Ga_2O_3$ bonded to a high thermal conductivity wafer.

13. The method of claim 12, the method further comprising:
    depositing a first dielectric layer on the substrate prior to depositing the refractory material.

14. The method of claim 13, further comprising:
    selectively removing the first dielectric layer after the implant ionization to expose the high-conductivity source and high-conductivity drain contact regions.

15. The method of claim 13, wherein the first dielectric layer comprises more than one material.

16. The method of claim 15, wherein the first dielectric layer comprises an alternating stack.

17. The method of claim 1, wherein the first dielectric layer comprises a bi/tri layer dielectric.

18. The method of claim 1, wherein the first dielectric is selected from a group consisting of $SiO_2$, $Al_2O_3$, AlN, and combinations thereof.

19. The method of claim 12, wherein etching the refractory material comprises:
    patterning the refractory material with one of optical lithography and nanolithography; and
    removing material with one of wet or dry etching.

20. The method of claim 12, wherein the refractory material comprises tungsten.

21. The method of claim 12, further comprising:
    depositing a second dielectric layer after etching the refractory material and prior to implant ionization.

22. The method of claim 21, further comprising:
    selectively removing the second dielectric layer after the implant ionization to expose the source and drain contact regions.

* * * * *